United States Patent [19]

Brown et al.

[11] 4,188,589
[45] Feb. 12, 1980

[54] AUTOMATIC SIGNAL ACQUISITION MEANS FOR A PHASE LOCKED LOOP WITH ANTI-SIDEBAND LOCK PROTECTION

[75] Inventors: Kenneth H. Brown, Scottsdale; Michael E. Carr, Tempe; Charles W. Rook, Phoenix, all of Ariz.

[73] Assignee: Motorola, Inc., Schaumburg, Ill.

[21] Appl. No.: 939,081

[22] Filed: Sep. 1, 1978

[51] Int. Cl.$^2$ ............................................. H03B 3/04
[52] U.S. Cl. ........................................ 331/12; 325/423; 329/122; 331/17; 331/25
[58] Field of Search ................................... 331/10–12, 331/17, 18, 25; 329/122, 124; 325/421–423

[56] References Cited

U.S. PATENT DOCUMENTS 3,768,030   5/1972   Brown et al. ........................... 331/12

OTHER PUBLICATIONS

Lloyd, "Here's a Better Way to Design a 90° Phase-Difference Network", Electronic Design, Jul. 22, 1971, p. 78.

Shirley, "Shift Phase Independent of Frequency", Electronic Design, Sep. 1, 1979, pp. 62–66.

Primary Examiner—Siegfried H. Grimm
Attorney, Agent, or Firm—Eugene A. Parsons

[57] ABSTRACT

The acquisition means includes a voltage controlled oscillator, comparison means for comparing an input signal to a signal from the voltage controlled oscillator, filtering means and a summing network connected in a phase-locked loop and providing an output signal at an output thereof at the input of said summing network, a signal multiplying network connected to receive the input signal and a signal from the VCO of the phase-locked loop and providing an output signal approximately 90 degrees out of phase with the output signal of the phase locked loop and two all pass networks connecting the output signals from the multiplying network and the phase locked loop to two inputs of a multiplier which has an output connected to the summing network, the all pass networks being designed to shift the phases of the signals so that they are in phase when applied to the multiplier.

7 Claims, 2 Drawing Figures

AUTOMATIC SIGNAL ACQUISITION MEANS FOR A PHASE LOCKED LOOP WITH ANTI-SIDEBAND LOCK PROTECTION

BACKGROUND OF THE INVENTION

The present invention pertains to an improved automatic signal acquisition means for a phase locked loop with anti-sideband lock protection. In acquisition means, such as that described in U.S. Pat. No. 3,768,030, entitled "Automatic Signal Acquisition Means For Phase Lock Loop With Anti-Sideband Lock Protection", issued Oct. 23, 1973 and assigned to the same assignee, utilizing a differentiating network and/or an integrating network to provide a phase shift and a DC term for generation of a control signal, the bandwidth of the acquisition means is relatively narrow and, consequently, the receiver sensitivity is substantially improved.

SUMMARY OF THE INVENTION

The present invention pertains to improved automatic signal acquisition means for a phase locked loop with anti-sideband lock protection and including a signal multiplying network connected to receive the input signal and a signal from the VCO of the phase locked loop for providing a first signal 90 degrees out of phase with a second signal at the output of the phase locked loop, the improvement including all pass networks connecting the first and second signals to a multiplier, the output of which is summed with the output of the phase locked loop and utilized as a control signal for the VCO. The greater frequency response of the all pass networks provides a substantial improvement in the operation of the acquisition means and improves the sensitivity of the receiver utilizing the acquisition means, as well as the anti-sideband lock.

It is an object of the present invention to provide new and improved automatic signal acquisition means for a phase locked loop with anti-sideband lock protection wherein receiver sensitivity and anti-sideband lock are substantially improved.

It is a further object of the present invention to provide improved automatic signal acquisition means for a phase locked loop with anti-sideband lock protection wherein the frequency response of the acquisition means is expanded to greatly improve the operation thereof.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the Figures.

DESCRIPTION OF THE PREFERRED EMBODIMENT

Figure 1:
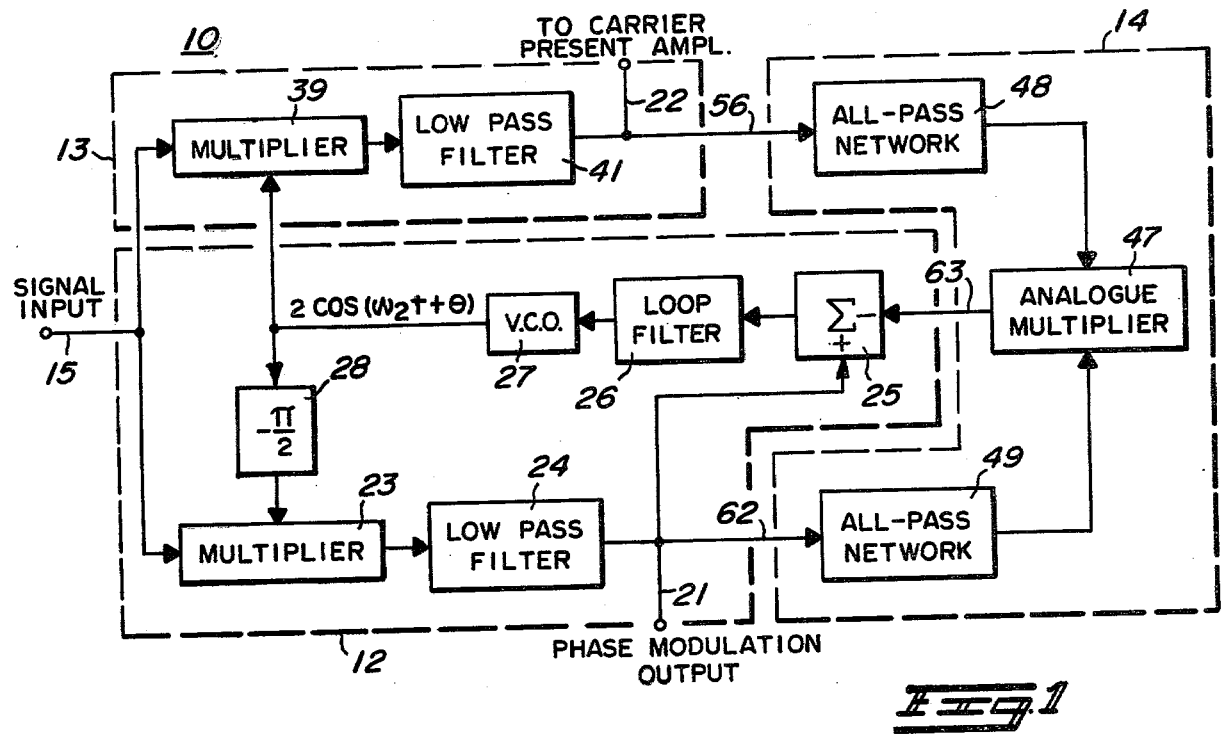
FIG. 1 is a block diagram of automatic signal acquisition means incorporating the present invention.

Referring to FIG. 1, automatic signal acquisition means, generally designated 10, are illustrated. The acquisition means 10 includes a phase lock loop network 12, a signal multiplying network 13 which also serves to give an amplitude signal when the loop is in phase lock, and an acquisition aid network 14. A complete description of the operation of these various networks is available in the above described patent, U.S. Pat. No. 3,768,030, and will only be reviewed briefly herein. The input signal, which may be of an intermediate frequency resulting from the heterodyning of the received signal with a local oscillator in the RF portion of a receiver (not shown), is applied to the phase lock loop network 12 and the signal multiplying section 13 respectively. The output of the phase lock loop network 12 is a phase modulated signal and is applied to one input of the acquisition aid network 14, as well as being available at the output 21 to be applied to further appropriate circuitry (not shown). The output of the signal multiplying network 13 is applied to a second input of the acquisition aid network 14 and is also available at the output 22 for application to a carrier present amplifier (not shown), indicating when the phase lock loop is in lock. The components of the phase lock loop network 12 include a signal multiplier 23 which also serves as a phase detector, a low pass filter 24, a summing network 25, a loop filter 26, a voltage controlled oscillator (VCO) 27 and a 90 degrees phase shift network 28. The signal multiplying network 13 includes a signal multiplier 39 and a low pass filter 41. All of these components may be of well known forms and are connected in a well known manner, as thoroughly described in the above identified patent.

The acquisition aid network 14 comprises an analog multiplier 47, for example, a four quadrant analog multiplier and two all pass networks 48 and 49. The input signal to acquisition aid network 14 from the signal multiplying network 13 is supplied through the all pass network 48 to one input of the analog multiplier 47. The other input of the analog multiplier 47 receives a signal from the output of the phase lock loop 12 by way of the all pass network 49. The output of the analog multiplier 47 is connected to one input of the summing network 25. The signal at the output of the analog multiplier 47 is the product of the signals applied to the two inputs thereof and is shown as being summed negatively, by the negative sign, at the input to the summing network 25. The negative summing of this signal is for purposes of having the control signal components of the proper relative signs. The other input to the summing network 25 is the output signal from the phase lock loop network 12 and this signal is summed positively by the summing network 25 as shown by the positive sign.

The all pass networks 48 and 49 may be designed in accordance with well known techniques to provide a 90 degree phase differential therebetween. Therefore, the signals which are 90 degrees out of phase at the outputs of the phase locked loop 12 and the signal multiplying network 13, will be in phase when applied to the multiplier 47. Further, this phase differential will occur over a substantial band of frequencies and the amplitude of the signals from the phase locked loop 12 and the signal multiplying network 13 will be substantially unaffected by the all pass networks 48 or 49. The all pass networks 48 and 49 can readily be designed to give an approximate 90 degree phase differential therebetween up to, and above, a frequency ratio (the upper input frequency to the lower input frequency) of 100.

Figure 2:
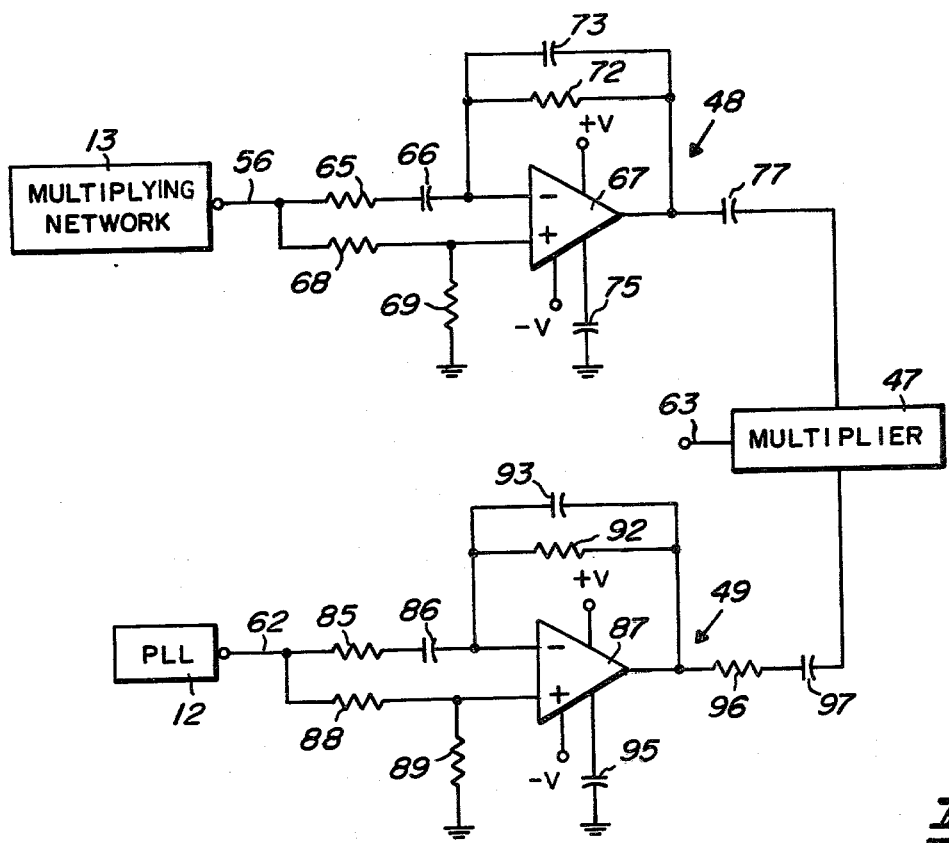
FIG. 2 is a diagram similar to FIG. 1 with the improvement illustrated in schematic form.

Referring specifically to FIG. 2, a schematic diagram of two representative all pass networks 48 and 49 are illustrated. A lead 56, connecting the output of the multiplying network 13 to the all pass network 48, is connected through a series connected resistor 65 and capacitor 66 to the inverting input of an operational amplifier 67 and through a resistor 68 to the noninverting input of the amplifier 67. The noninverting input is also connected through a resistor 69 to ground. The inverting input is also connected through a parallel combination of a resistor 72 and a capacitor 73 to the output of the amplifier 67. The output is further connected to one input of the multiplier 47 through a capacitor 77. In addition, pin 4 of the operational amplifier 67 is connected to a terminal adapted to have a negative voltage applied thereto, pin 7 is connected to a terminal adapted to have a positive voltage connected thereto and pin 8 is connected through a capacitor 75 to ground.

The output of the phase locked loop 12 is connected by way of a lead 62 to the input of the all pass network 49. The input (lead 62) of the all pass network 49 is connected through a series combination of a resistor 85 and capacitor 86 to the inverting input of an operational amplifier 87 and through a resistor 88 to the noninverting input. The noninverting input is also connected through a resistor 89 to ground. The inverting input of the operational amplifier 87 is also connected through a parallel combination of a resistor 92 and a capacitor 93 to the output thereof, which output is also connected to an input of the multiplier 47 through a series connected resistor 96 and capacitor 97. In addition, pin 4 of the operational amplifier 87 is conected to a terminal adapted to have a negative voltage source applied thereto, pin 7 is connected to a terminal adapted to have a positive voltage source connected thereto and pin 8 is connected through a capacitor 95 to ground.

In the specific embodiment illustrated in FIG. 2 the all pass networks 48 and 49 are designed to provide an approximate 90 degree phase differential therebetween up to a frequency ratio of approximately 100 with the lower frequency being approximately 2000 hertz and the upper frequency being approximately 200 kilohertz. To provide these design requirements, typical component values are listed below.

| Operation Amplifiers | |
| --- | --- |
| 67 and 87 | HA 2520 (Harris Corp.) |
| +V | +6 volts |
| −V | −6 volts |
| Resistors | K ohms |
| 65 | 10 |
| 68 | 5.1 |
| 69 | 5.1 |
| 72 | 19.6 |
| 85 | 10 |
| 88 | 5.1 |
| 89 | 5.1 |
| 92 | 19.6 |
| 96 | 15 |
| Capacitors | |
| 66 | 180 pfd |
| 73 | 33 pfd |
| 75 | 33 pfd |
| 77 | 1 mfd |
| 86 | .1 mfd |
| 93 | 180 pfd |
| 95 | 33 pfd |
| 97 | .22 mfd |

Thus, the use of all pass networks in an automatic signal acquisition means for a phase locked loop with anti-sideband lock protection is disclosed wherein the phase differential can be maintained over a very wide frequency range, without substantially affecting the amplitude of signals passing therethrough, so that the operation of the automatic signal acquisition means is greatly improved. Two all pass networks providing each of the inputs to the analog multiplier 47 can be easily designed utilizing well known techniques to provide the required phase differential, but, in some instances, it may be desirable to design a single all pass network to be used in only one or the other of the inputs of the analog multiplier 47. While single all pass networks capable of providing a 90 degree phase differential are relatively complicated, such networks are possible and should be considered within the scope of this invention. The prior art differentiating network and/or integrating network severely alters the amplitude of the input signal, or signals, as the frequency changes and, also, the amount of phase shift changes with frequency. These frequency dependent variations severely limit the operating characteristics of the prior art automatic signal acquisition means and greatly restrict the use and value thereof. Through a great amount of research and experimenting, it was discovered that the all pass networks previously described could greatly enhance the operation of automatic signal acquisition means. Receivers incorporating the improved automatic signal acquisition means have a substantially improved sensitivity and anti-sideband lock protection as well as the capability of two carrier discrimination.

While we have shown and described a specific embodiment of this invention, further modifications and improvements will occur to those skilled in the art. We desire it to be understood, therefore, that this invention is not limited to the particular form shown and we intend in the appended claim to cover all modifications which do not depart from the spirit and scope of this invention.

What is claimed is:

1. Improved automatic signal acquisition means for a phase-locked loop with anti-sideband lock protection including a voltage controlled oscillator, comparison means for comparing an input signal to a signal from the voltage controlled oscillator, filtering means and a summing network connected in a phase-locked loop and providing an output signal at an output thereof at the input of said summing network, a signal multiplying network connected to receive the input signal and a signal from the voltage controlled oscillator in the phase-locked loop for providing a first signal at an output thereof, a multiplier having first and second inputs and an output, and the summing network in the phase-locked loop connected to the output of the multiplier for combining the multiplier output signal with the phase-locked loop output signal, the improvement comprising first and second all-pass networks connected between the output of the signal multiplying network and one input of the multiplier and between the output of the phase-locked loop and the other input of the multiplier, respectively, said all-pass networks being characterized by shifting the phases of the signals applied thereto so that the signals applied to the inputs of the multiplier are approximately in phase.

2. Improved automatic signal acquisition means as claimed in claim 1 wherein the first signal and the phase-locked loop output signal are separated by a 90 degree phase difference as a result of phase shifting apparatus in the phase locked loop and the phase shift provided by the first and second all-pass networks substantially eliminates the 90 degree phase difference.

3. Improved automatic signal acquisition means as claimed in claim 1 wherein each of the first and second all-pass networks includes an operational amplifier.

4. Improved automatic signal acquisition means as claimed in claim 3 wherein the operational amplifier is used in an active, all pass filter network.

5. Improved automatic signal acquisition means for a phase-locked loop with anti-sideband lock protection including a voltage controlled oscillator, comparison means for comparing an input signal to a signal from the voltage controlled oscillator, filtering means and a summing network connected in a phase-locked loop and providing an output signal at an output thereof at the input of said summing network, a signal multiplying network connected to receive the input signal and a signal from the voltage controlled oscillator in the phase-locked loop for providing a first signal at an output thereof, a multiplier having first and second inputs and an output, and the summing network in the phase-locked loop connected to the output of the multiplier for combining the multiplier output signal with the phase-locked loop output signal, the improvement comprising a first all-pass network connected between the output of the signal multiplying network and one input of the multiplier and a second all-pass network connected between the output of the phase-locked loop and the other input of the multiplier, said first and second all-pass networks being designed to provide a phase differential therebetween of approximately 90 degrees.

6. Improved automatic signal acquisition means for a phase-locked loop with anti-sideband lock protection including a voltage controlled oscillator, comparison means for comparing an input signal to a signal from the voltage controlled oscillator, filtering means and a summing network connected in a phase-locked loop and providing an output signal at an output thereof at the input of said summing network, a signal multiplying network connected to receive the input signal and a signal from the voltage controlled oscillator in the phase-locked loop for providing a first signal at an output thereof, a multiplier having first and second inputs and an output, and the summing network in the phase-locked loop connected to the output of the multiplier for combining the multiplier output signal with the phase-locked loop output signal, the improvement comprising an all-pass network connected between one of the output of the phase-locked loop and one input of the multiplier, and the output of the signal multiplying network and the other input of the multiplier, said all-pass network being designed to provide a phase differential between the input and the output of approximately 90 degrees.

7. Improved automatic signal acquisition means for a phase-locked loop with anti-sideband lock protection including a voltage controlled oscillator, comparison means for comparing an input signal to a signal from the voltage controlled oscillator, filtering means and a summing network connected in a phase-locked loop and providing an output signal at an output thereof at the input of said summing network, a signal multiplying network connected to receive the input signal and a signal from the voltage controlled oscillator in the phase-locked loop for providing a first signal at an output thereof, a multiplier having first and second inputs and an output, and the summing network in the phase-locked loop connected to the output of the multiplier for combining the multiplier output signal with the phase-locked loop output signal, the improvement comprising coupling means including all-pass network means and coupling the output of the signal multiplying network to one input of the multiplier and the output of the phase-locked loop to the other input of the multiplier, said all-pass network means shifting the phase of signals applied thereto so that the signals applied to the inputs of the multiplier are approximately in phase.

* * * * *